United States Patent
Shimamura et al.

[11] Patent Number: 5,663,644
[45] Date of Patent: Sep. 2, 1997

[54] MAGNETORESISTIVE SENSOR HAVING A BIAS FIELD APPLIED AT APPROXIMATELY 56°

[75] Inventors: Hiroshi Shimamura, Katano; Satoru Mitani, Hirakata, both of Japan

[73] Assignee: Matsushita Electric Industrial Co., Ltd., Osaka, Japan

[21] Appl. No.: 632,403

[22] PCT Filed: Aug. 23, 1995

[86] PCT No.: PCT/JP95/01674

§ 371 Date: Aug. 5, 1996

§ 102(e) Date: Aug. 5, 1996

[87] PCT Pub. No.: WO96/06329

PCT Pub. Date: Feb. 29, 1996

[30] Foreign Application Priority Data

Aug. 23, 1994 [JP] Japan .................... 6-198292

[51] Int. Cl.$^6$ ................ G01R 33/02; G01B 5/30; G01D 5/245
[52] U.S. Cl. ............... 324/252; 324/207.21; 338/32 R
[58] Field of Search ............... 324/207.21, 252; 338/32 R; 360/113

[56] References Cited

FOREIGN PATENT DOCUMENTS

| | | |
|---|---|---|
| 55-130104 | 10/1980 | Japan . |
| 58-16580A | 1/1983 | Japan . |
| 60-34086A | 2/1985 | Japan . |
| 1-45008B2 | 10/1989 | Japan . |
| 5-34103A | 2/1993 | Japan . |
| 5-322510A | 12/1993 | Japan . |
| 5-341026A | 12/1993 | Japan . |

Primary Examiner—Walter E. Snow
Attorney, Agent, or Firm—Watson Cole Stevens Davis, P.L.L.C.

[57] ABSTRACT

The present invention relates to a magnetic signal detection apparatus utilizing a ferromagnetic thin film magneto-resistive element which produces a maximum output of high linearity with an optimum direction of magnetization of the thin film magneto-resistive element by a small biasing magnetic field. A biasing magnetic field Hb is applied at an angle of approximately 56° to a direction of a current I along a longitudinal direction of a thin film magneto-resistive element (2) on a substrate (1) to make a direction of magnetization M to approximately 45° to attain a highly linear output between power supply terminals (4, 5).

8 Claims, 10 Drawing Sheets

PRIOR ART

FIG.8

PRIOR ART

FIG.9

PRIOR ART

FIG.10

MAGNETORESISTIVE SENSOR HAVING A BIAS FIELD APPLIED AT APPROXIMATELY 56°

TECHNICAL FIELD

The present invention relates to a magnetic signal detection apparatus utilizing a ferromagnetic thin film magneto-resistive element.

BACKGROUND ART

Figure 8:
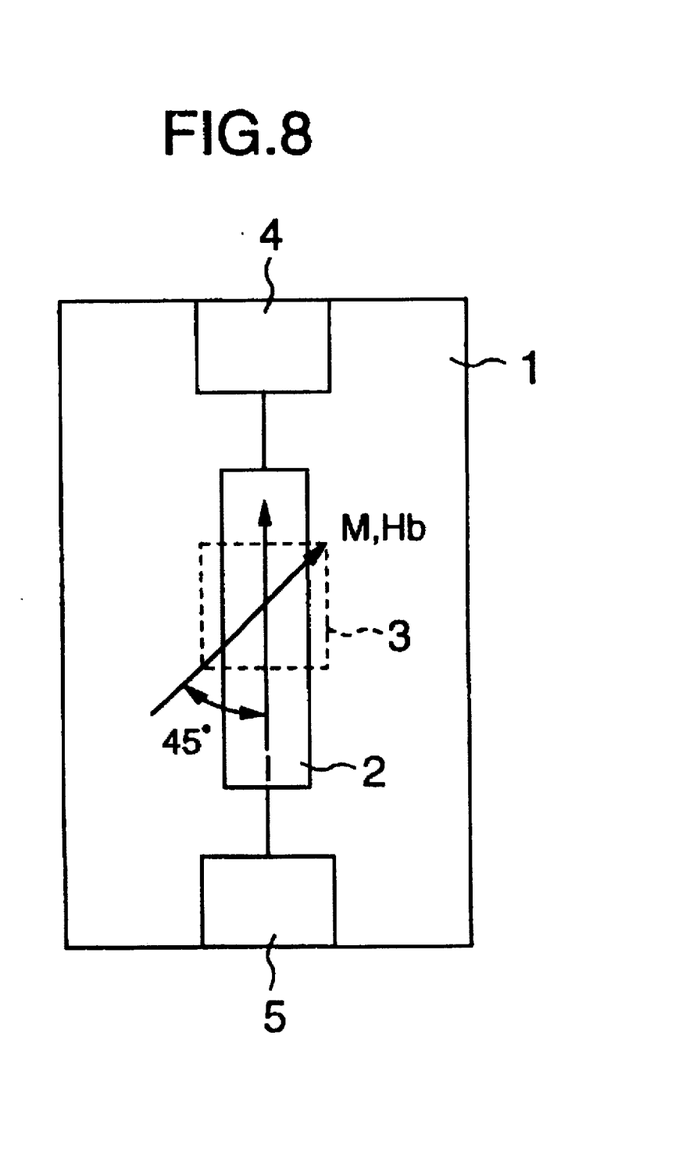
FIG. 8 shows a construction of a prior art thin film magneto-resistive element.
Figure 9:
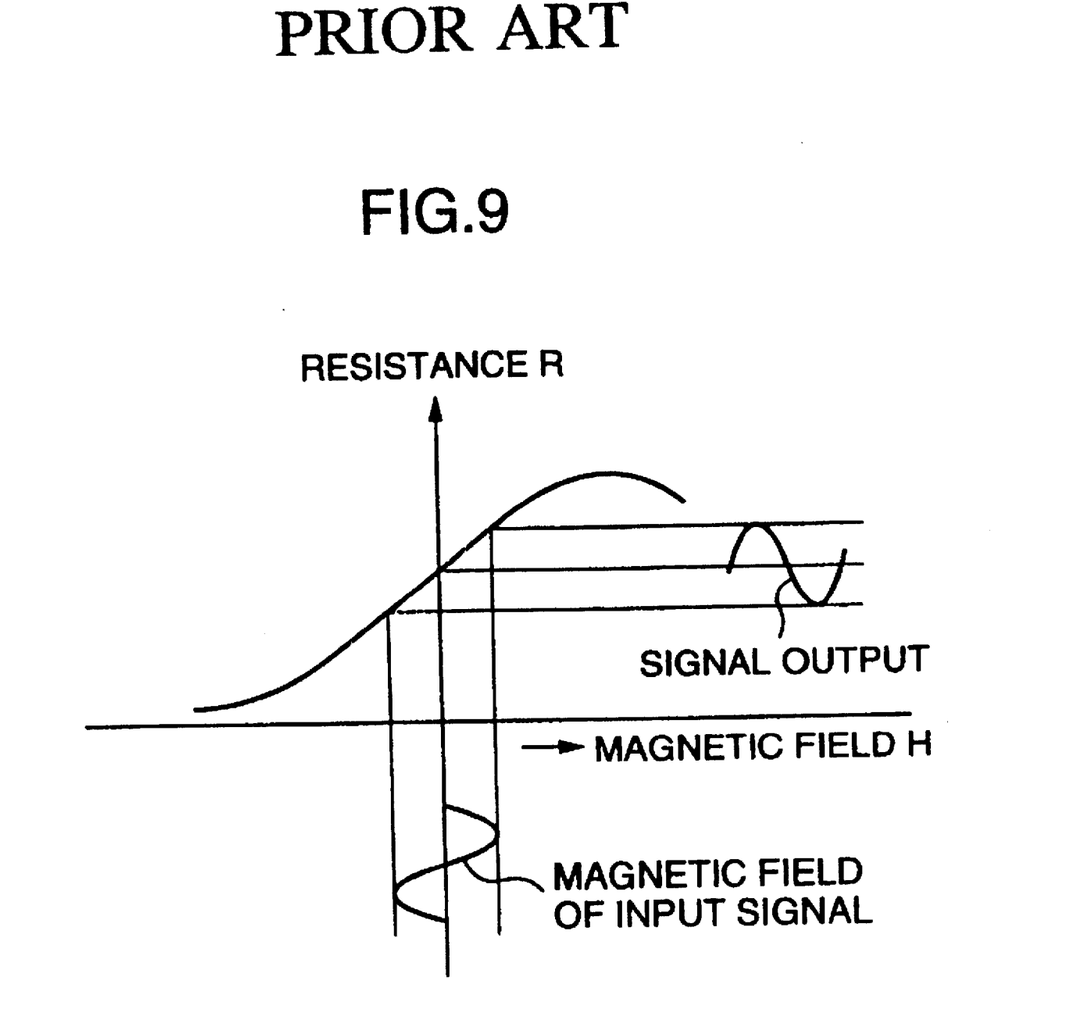
FIG. 9 shows a characteristic chart of magneto-resistance when the magnetization M is oriented substantially 45°.

It has been known that a reproduced output and a reproduction sensitivity in converting a small signal magnetic field Hs to a resistance change in a resistive element are enhanced by using a ferromagnetic thin film magneto-resistive element (MR element) as a reproducing head and setting an angle θ to approximately 45°, where θ is an angle made between a direction of magnetization M of the ferromagnetic thin film magneto-resistive element and a current I flowing through the resistive element. An example of prior art in which a biasing magnetic field Hb is applied in a direction of 45° to the direction of the current I is shown in FIG. 8. In FIG. 8, by applying the biasing magnetic field Hb by a biasing magnet 3 in the direction of approximately 45° to the direction of the current I flowing through the thin film magneto-resistive element 2 as shown in a magneto-resistance characteristic of FIG. 9, an operating point at which high linearity and high reproduced output are attained is selected. In FIG. 8, numerals 4 and 5 denote power terminals for supplying the current to the thin film magneto-resistive element 2.

Figure 10:
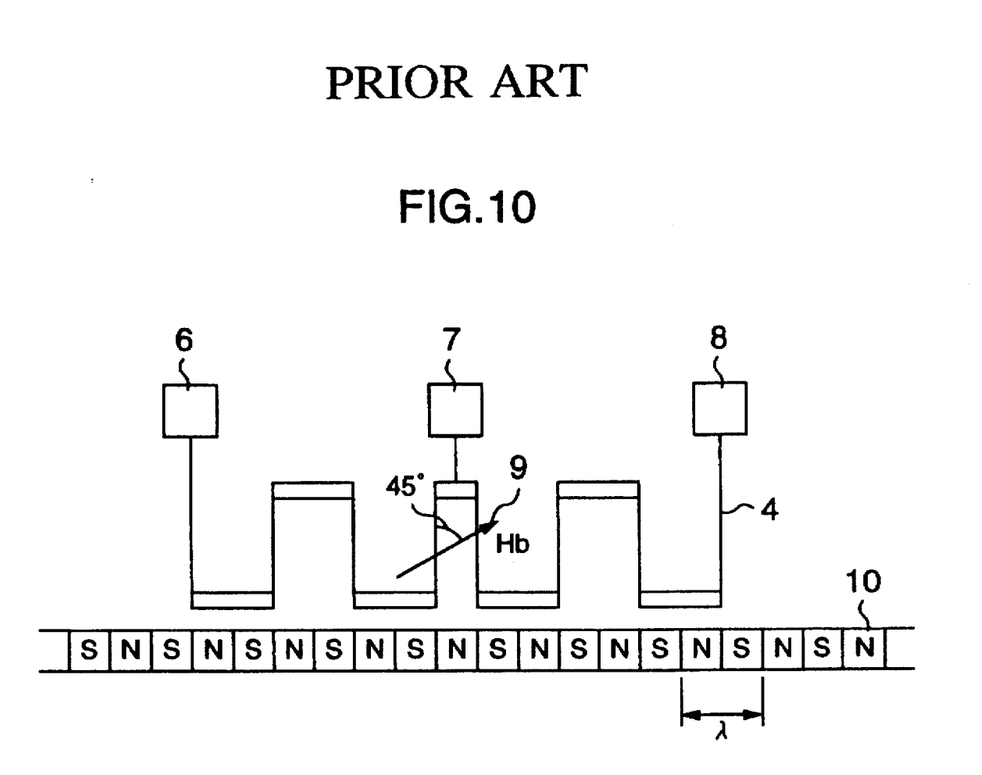
FIG. 10 shows an arrangement of a prior art detection element to a magnetic signal recording medium.

It has also been known to arrange ferro-magnetic thin film magneto-resistive elements at an interval of one half of a magnetic lattice pitch λ and apply a biasing magnetic field. In addition, a method for applying the biasing magnetic field in the direction of 45° has been known as shown in FIG. 10 (JP-B-1-45008). In FIG. 10, numerals 6 and 8 denote power terminals, numeral 7 denotes an output terminal, numeral 9 denotes a biasing magnetic field and numeral 10 denotes a signal magnetic field recording medium.

In any one of the above methods, the biasing magnetic field is applied in the direction of 45° to a longitudinal direction (current direction) of the resistive element. When an MR film formed on a substrate (made of ceramic or glass material) is patterned to form a resistive element (having a film width of several μm_ several tens μm)., the direction of magnetization M of the resistive element is oriented in the longitudinal direction of the resistive element by a shape effect. In order to orient the magnetization in the direction of 45° to the longitudinal direction by the biasing magnetic field applied in the direction of 45° to the longitudinal direction of the resistive element, it is necessary to apply a large biasing magnetic field in the order of several thousands _ ten thousands Gausses because a shape energy possessed by the resistive element is large. When a relatively small biasing magnetic field (several hundreds Gausses) is applied, the magnetization of the resistive element is oriented to a direction smaller than 45°. Because of those phenomena, the following problems arise.

(1) Because the magnetization of the resistive element is bound by the large biasing magnetic field or because the direction of magnetization is smaller than 45°, a detection output of a small leakage magnetic field of a magnetic material bearing a magnetic signal to be detected is small, a signal to noise ratio is small, a distortion increases and the processing by a signal processing circuit is difficult to attain. Recently, the compactness of the apparatus, the enhancement of the control accuracy and the fine magnetic signal for high fidelity reproduction are required and hence the leakage magnetic field to be detected is becoming more and more weak.

(2) It is necessary to bring the detection element as closely to the magnetic material bearing the magnetic signal as possible to detect in a large area of the signal magnetic field to be detected in order to attain a large output. In order to detect a relative linear displacement or rotational displacement between the magnetic material to be detected and the detection element by a uniform fine gap, it is necessary to precisely machine a surface of the magnetic material and adjust the gap by using a gap sheet. This requires a time consuming manufacturing process.

DISCLOSURE OF INVENTION

It is an object of the present invention to provide a magnetic signal detection apparatus which solves the above problems encountered in the prior art and allows the orientation of the magnetization M to ±45° or ±135° relative to the current with a minimum biasing magnetic field.

In order to achieve the above object, the magnetic signal detection apparatus of the present invention comprises an anisotropic resistive element arranged to face in a face-to-face fashion or perpendicularly to a magnetic signal recording surface on a substrate and made of a ferromagnetic metal thin film, and a magnetic filed application apparatus for applying a biasing magnetic field of a predetermined angle to said resistive element. The direction of application of the biasing magnetic field by said magnetic field application device is set to meet the following formula to the direction of current flowing through said resistive element:

$$\alpha = \pm(\sin^{-1}((Ku+Ks)/H \times M) + \phi)$$

where $\phi$: 45° or 135°

$\alpha$: angle between current and biasing magnetic field

Ku: anisotropy energy (J/m$^3$)

Ks: contour anisotropy energy (J/m$^3$)

H: biasing magnetic field (A/m)

M: saturation magnetization (T)

More specifically, the biasing magnetic field to the resistive element is no smaller than approximately ±47° and no larger than approximately ±75° to the direction of the current or the biasing magnetic field to the resistive element is no smaller than approximately ±105° and no larger than approximately ±133° to the direction of the current.

BEST MODES OF CARRYING OUT THE INVENTION

The preferred embodiments of the present invention are now explained with reference to the drawings.

Figure 4:
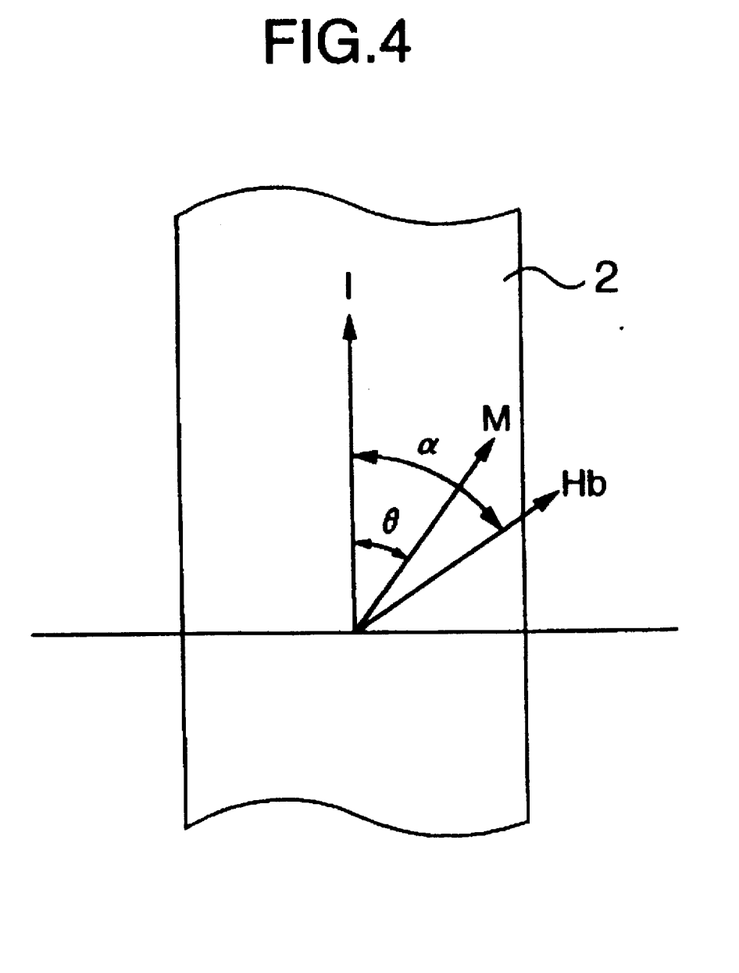
FIG. 4 shows a relation between a direction of a biasing magnetic field Hb and a direction of magnetization M when the biasing magnetic field is applied.

When a biasing magnetic field Hb is applied to a film having an axis of easy magnetization along a longitudinal direction of a ferromagnetic thin film resistive element (direction of a current I) as shown in FIG. 4, the direction of magnetization M is stabilized at a state in which a total energy Et is minimum and an angle between the magnetization M and the current I is determined. The total energy is a sum of an anisotropy energy $Ku \times \sin^2 \theta$, a magneto-static energy $Ks \times \sin^2 \theta$ owing to the contour effect and a Zehmann energy $-H \times M \times \cos(\theta - \alpha)$, that is;

$$Et = Ku \times \sin^2\theta + Ks \times \sin^2\theta - H \times M \times \cos(\alpha - \theta) \quad (1)$$

where

Ku: anisotropy energy (J/m$^3$)

Ks: contour anisotropy energy (J/m$^3$)

M: saturation magnetization (T)

H: biasing magnetic field (A/m)

$\theta$: angle between current and magnetization $\alpha$: angle between current and biasing magnetic field A general relation between $\alpha$ and H when $\theta$ is $\pm 45°$ or $\pm 135°$ is given by:

$$\alpha = \pm(\sin^{-1}((Ku+Ks)/H \times M) + \phi) \quad (2)$$

where $\phi$: 45° or 135° film material: NiFe (permalloy)

film thickness: 0.1 µm film width: 20 µm

Placing Ku=200, Ks=2000 and M=1 in the formula (2), a relation between $\alpha$ and H is given by:

$$\alpha = \pm(\sin^{-1}(2200/H) + 45°) \quad (3)$$

Figure 6:
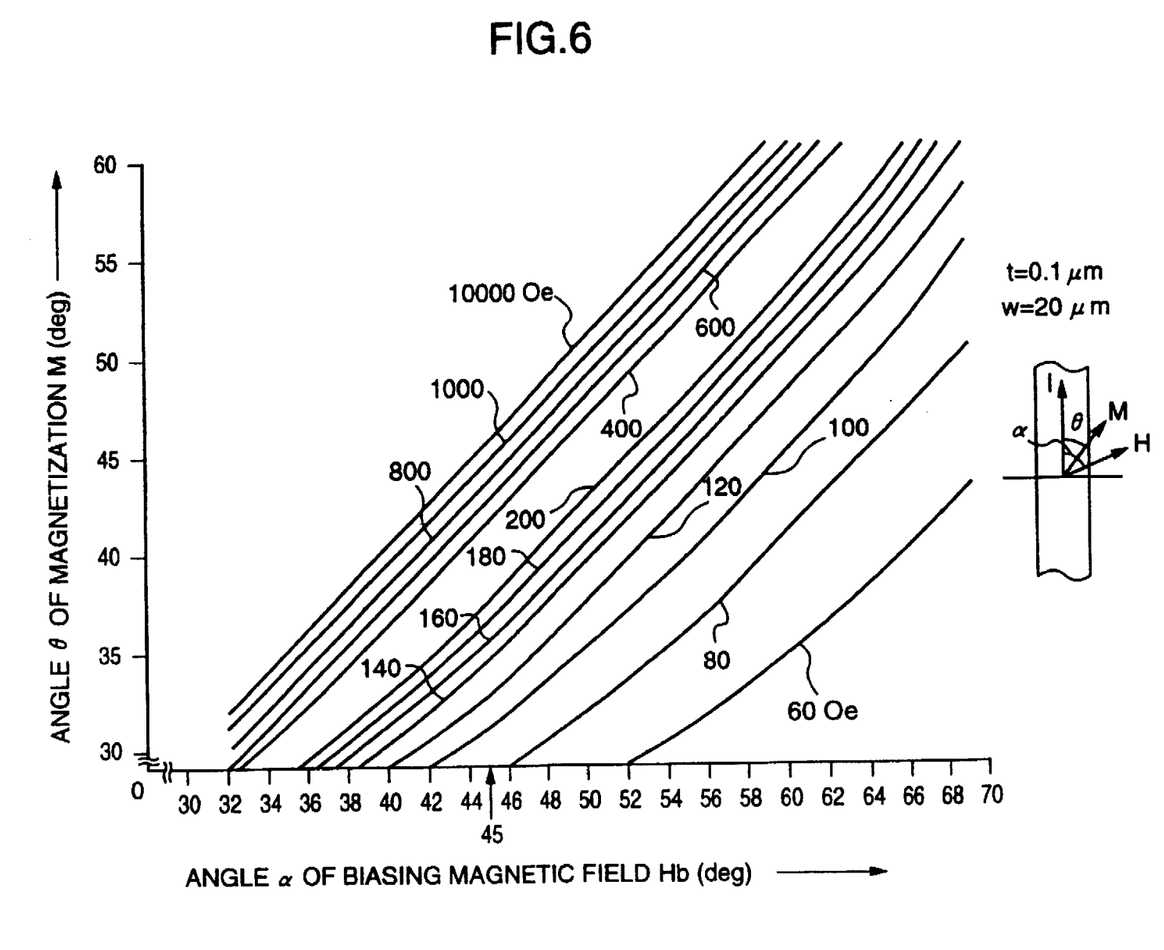
FIG. 6 shows an angle of the biasing magnetic field and an angle of the magnetization by using a biasing magnetic field strength as a parameter.

The formula (3) indicating the relation of $\alpha$ and H is shown in FIG. 6, where H=Hb×80.

For example, assuming that the film thickness =0.1 µm, the film width =20 µm, the biasing magnetic field strength Hb=140 Oersteds (Oe) and the permaloy film is used, the direction of application of Hb required to orient the magnetization M to a direction of substantially 45° to the longitudinal direction (the direction of current) of the resistive element is approximately 56° to the longitudinal direction of the resistive element.

Assuming that a biasing magnetic field is applied in the direction of substantially 45° in accordance with the prior art, the biasing magnetic field strength to orient the magnetization to substantially 45° in the ferromagnetic thin film (MR film) is greater than approximately 10,000 Oe. Similarly, when Hb is relatively weak, approximately 140 Oe and it is applied in the direction of 45° to the direction of current, the magnetization is oriented in the direction of approximately 33°. An output when the magnetic signal is reproduced by the construction of FIG. 2 by using the MR film having a film thickness of 0.1 µm and a film width of 20 µm is calculated by using an angle between the magnetization M and the current as a parameter. When the applied voltage Vcc=5.0 V, the magneto-resistance change rate $\Delta\rho/\rho=0.026$ and the signal magnetic field Hs=10 Oe, the output voltage Vo=6.6 mV p-p with the biasing magnetic field strength Hb=140 Oe and the biasing magnetic field angle $\alpha=56°$. When the biasing magnetic field strength Hb=140 Oe and the biasing magnetic field angle $\alpha=45°$, Vo=6.2 mV p-p. It is understood that the former output is approximately 7% higher than the latter output. In order to orient the magnetization M to a direction of 45° when the biasing magnetic field angle $\alpha=45°$, it is necessary to apply the biasing magnetic field having the strength Hb of 10,000 Oe or larger, and the output is approximately 0.1 mV p-p which exhibits substantial decrease. Accordingly, the reproduced output is larger when the Hb of approximately 140 Oe is applied in the direction of 56° so that the magnetization M is oriented in the direction of approximately ±45° (or approximately ±135°). In the reproducing magnetic head with the construction shown in FIG. 1, the output is increased by applying the biasing magnetic field having the strength Hb=140 Oe in the direction of $\alpha=56°$.

In this manner, by applying the weak magnetic field strength Hb in the angle closer to the right angle to the direction of current than to the target angle of magnetization M, the angle between the magnetization M and the current is made to approximately ±45° (or approximately ±135°) so that the reproduction characteristic of the magnetic signal is improved.

Figure 5:
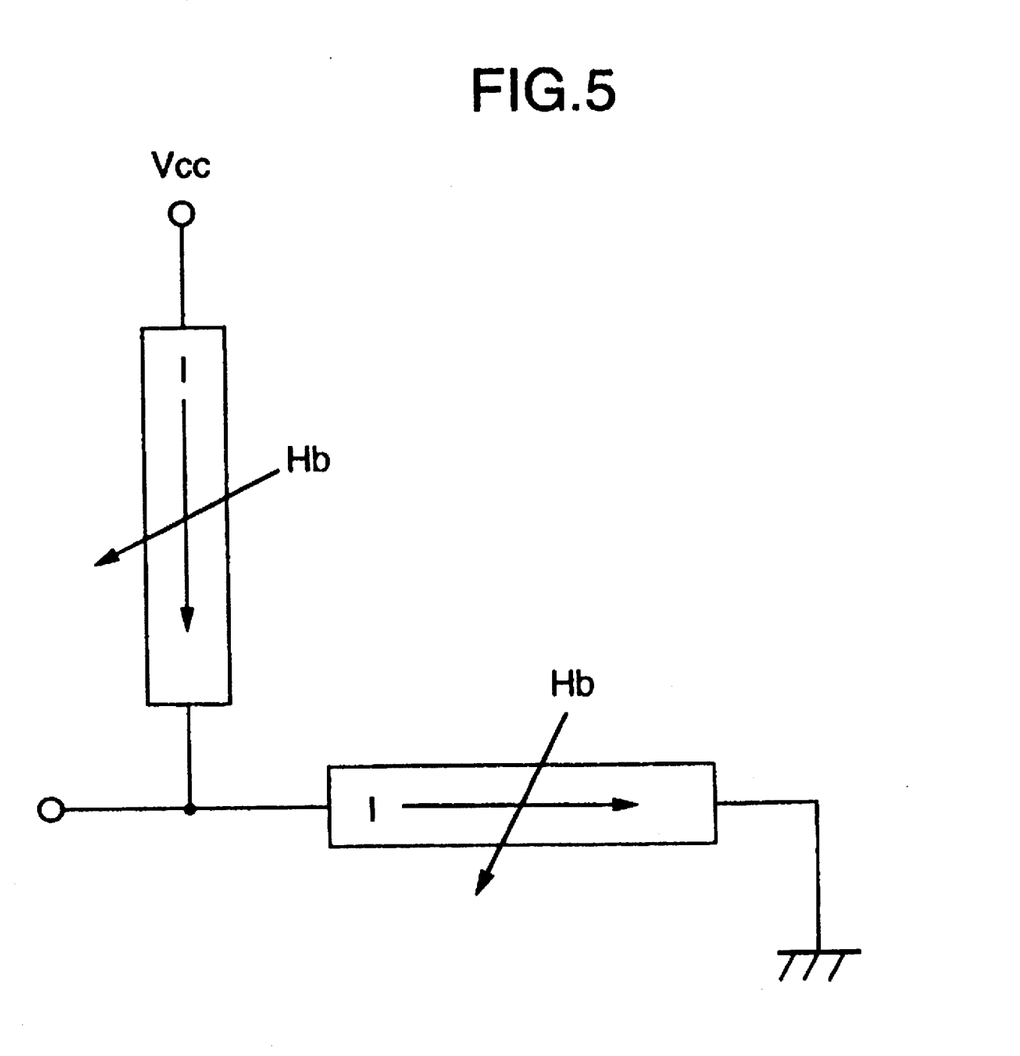
FIG. 5 illustrates a mid-point output voltage when the biasing magnetic field is applied in a direction of 56° to a direction of current.

As shown in FIG. 5, when two resistive elements are connected in series, the output from a midpoint is represented by:

$$K \times Vcc \times \cos^2\theta$$

where

K: proportional constant

Vcc: power supply voltage $\theta$: angle between magnetization M and current and in principle, a temperature drift becomes zero when $\theta=45°$. In this manner, the reproduction characteristic of the magnetic signal is improved by orienting the magnetization to a direction of ±45° or ±135° to the current direction.

As seen from FIG. 6, a relation between the biasing magnetic field strength Hb and the biasing angle $\theta$ is such that when Hb is increased, a difference $(\theta-\alpha)$ between the angle $\alpha$ of the biasing magnetic field strength Hb and the angle $\theta$ of the magnetization M decreases.

Figure 7:
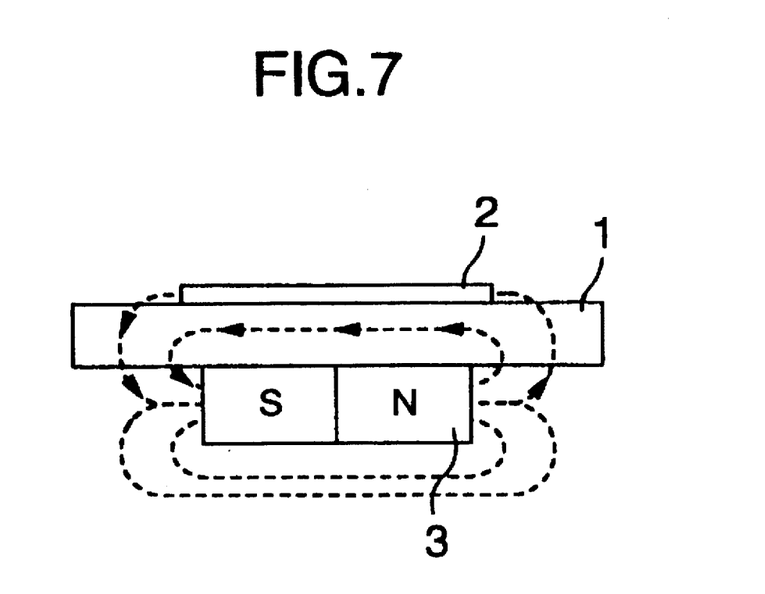
FIG. 7 shows an arrangement illustrating a relation among a biasing magnet, a substrate and an MR element when the biasing magnetic field is applied by the biasing magnet.

As a currently available magnet material for the biasing magnet, a neodium group having a large remanent magnetic flux density Br and a maximum magnetic flux density Brmax of approximately 13 KG is known. When it is used in a manner shown in FIG. 7, an applied magnetic flux strength on the resistive element is approximately 1400 Oe at maximum because the magnetic field is applied to the thin film resistive element through the thickness of the substrate (approximately 0.7 mm). The angle of the biasing magnetic field which results in approximately ±45° (or ±135°)

between the magnetization M and the current is, from the formula (3), approximately ±47° (or ±133°). On the other hand, as the applied magnetic field is decreased, the angle θ of the magnetization M significantly changes in the vicinity of 140 Oe. By taking the demagnetization due to the temperature change into account, the applied magnetic field strength is preferably at least 140 Oe. When the applied magnetic field strength is 140 Oe, the angle of the biasing magnetic field is approximately ±56° (or approximately ±124°). Accordingly, when the neodium magnet is used and the MR film thickness is 0.05_0.1 μm and the film width is 8_20 μm, the angle of the biasing magnetic field is approximately ±47°_±75° (or approximately ±105°_±133°).

Specifically, when NiFe is used as the MR film, the anisotropy energy Ku=5×40, and when Hb of 140 Oe or 1400 Oe is applied to the MR film having the film thickness of 0.05 μm_0.1 μm and the film width of 8 μm_20 μm, the angle α for the maximum output is shown below.

| Ku (J/m³) | Film Thickness (μm) | Film Width (μm) | Ks (J/m³) | α(°) when Hb = 140 Oe | α(°) when Hb = 1400 Oe |
|---|---|---|---|---|---|
| 200 | 0.05 | 20 | 1000 | 51.15 | 45.61 |
| 200 | 0.1 | 20 | 2000 | 56.32 | 46.12 |
| 200 | 0.05 | 8 | 2500 | 58.94 | 46.38 |
| 200 | 0.1 | 8 | 5000 | 72.66 | 47.66 |

Ks = film thickness/film width × 10⁴ × 40

When NiCo is used as the MR film, the anisotropy energy Ku=15×40, and when Hb of 140 Oe or 1400 Oe is applied to the MR film having the film thickness of 0.05 μm_0.1 μm and the film width of 8 μm_20 μm, the angle α for the maximum output is shown below.

| Ku (J/m³) | Film Thickness (μm) | Film Width (μm) | Ks (J/m³) | α(°) when Hb = 140 Oe | α(°) when Hb = 1400 Oe |
|---|---|---|---|---|---|
| 600 | 0.05 | 20 | 1000 | 53.21 | 45.82 |
| 600 | 0.1 | 20 | 2000 | 58.42 | 46.33 |
| 600 | 0.05 | 8 | 2500 | 61.06 | 46.58 |
| 600 | 0.1 | 8 | 5000 | 75.0 | 47.86 |

Ks = film thickness/film width × 10⁴ × 40

Accordingly, when a currently available magnet is used and the MR film having the film thickness of 0.05 μm_0.1 μm and the film width of 8 μm_20 μm is used, the biassing angle of the biasing magnet applied to the MR film is approximately ±47°_±75°.

Specific embodiments of the present invention are now explained in detail with reference to the drawings.

Figure 1:
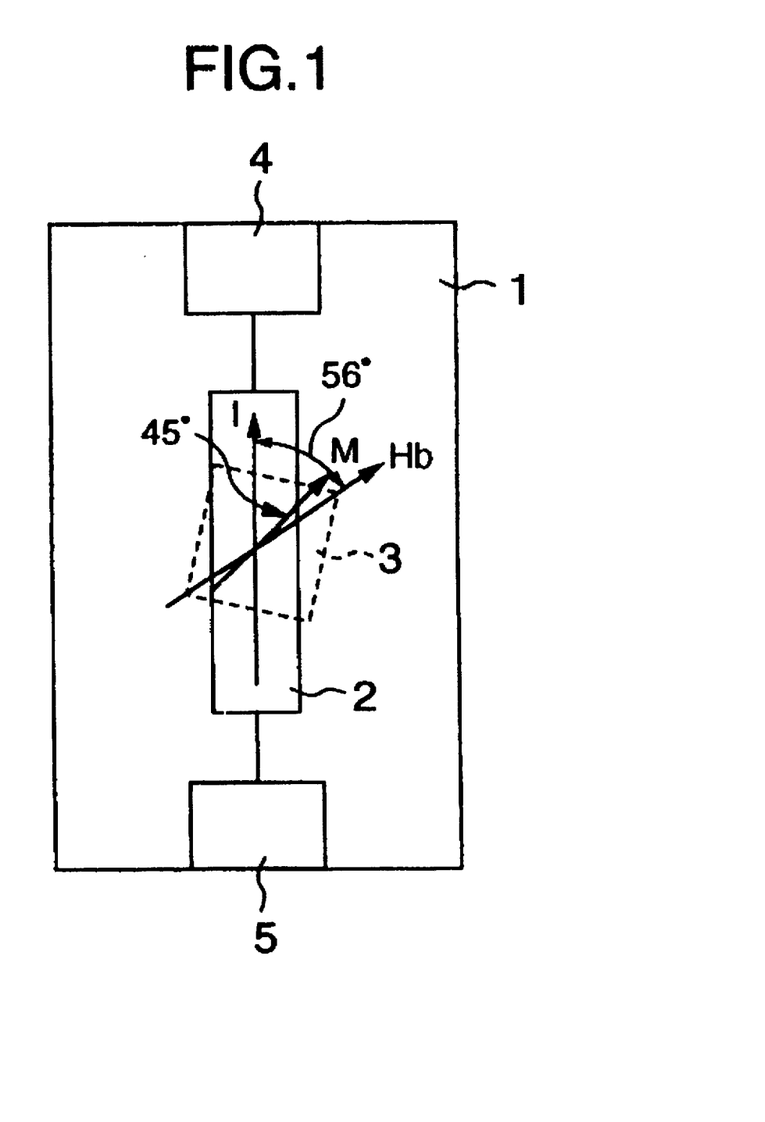
FIG. 1 shows a construction of a thin film magneto-resistive element in one embodiment of the present invention.

FIG. 1 shows a construction of the thin film magneto-resistive element in one embodiment in which a biasing magnetic field is applied in the direction of 56° to the longitudinal direction (the direction of the current I) to a detection element which faces a magnetic signal recording medium. Unlike FIG. 8 which shows the prior art, the biasing magnetic field Hb is applied by the biasing magnet 3 in the angle of 56° to the longitudinal direction (the direction of the current I) of the thin film magneto-resistive element 2 to orient the magnetization M to the angle of 45° to the longitudinal direction.

Figure 2:
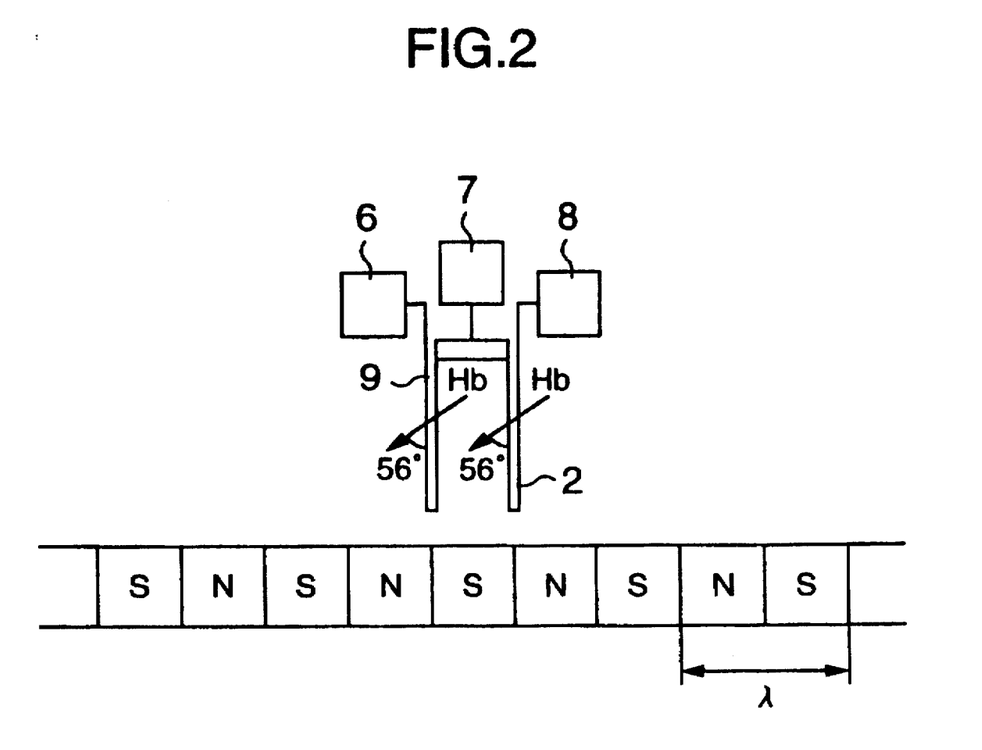
FIG. 2 shows an arrangement of a detection element to a magnetic signal recording medium in other embodiment.

FIG. 2 shows an arrangement of the detection element to the magnetic signal recording medium in other embodiment of the present invention. The thin film magneto-resistive elements are arranged at an interval of λ/2 where λ is a magnetic lattice pitch and the biasing magnetic field Hb is applied in the direction of approximately 56° so that the direction of magnetization is approximately 45° to the longitudinal direction of the resistive element.

Figure 3:
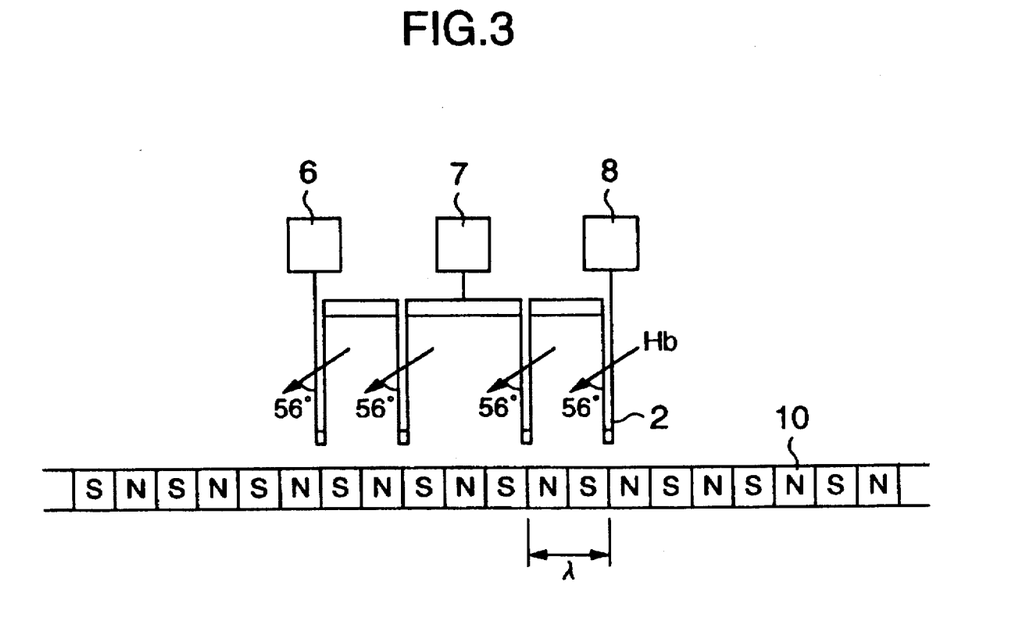
FIG. 3 shows an arrangement of the detection element to the magnetic signal recording medium in a further embodiment.

FIG. 3 shows an arrangement of the detection elements to the magnetic signal recording medium in a further embodiment of the present invention. The resistive elements are arranged at an interval of λ and they are divided into first group and second group with a separation of 3λ/2 between the first resistive element group and the second resistive element group, and the biasing magnetic field Hb is applied in the direction of approximately 56° so that the magnetization is oriented to approximately 45° to the longitudinal direction of the resistive element.

The thin film which forms the resistive element is made of a ferromagnetic material such as NiFe or NiCo having the film thickness of 0.05 μm_0.1 μm and the film width of 8 μm_20 μm, and a plurality of pieces are arranged in a zigzag pattern. A biasing magnetic field of approximately 140 Oe is applied so that it is approximately 56° to the longitudinal direction (the direction of the current) of the resistive element. The magnet which serves as a magnetic field application device to apply the biasing magnetic field to the detection element is made of ferrite or rare earth group isotropic material and it is integrally mounted on a substrate of the detection element by resin mold or adhered by epoxy bond. Alternatively, for the biasing magnet, a biasing permanent magnetic film layer made of a high coercivity magnetic film may be arranged in the vicinity of the detection element to apply the biasing magnetic field, or a current may be supplied to an inductor so that a magnetic field generated by the current is applied, or a current may be supplied to a conductor so that a magnetic field generated around the conductor is applied.

In the respective embodiments, the thin film magneto-resistive element may face perpendicularly to the magnetic signal recording medium instead of face-to-face.

In accordance with the above embodiments, the biasing magnetic field may be small and the magnet or coil for applying the biasing magnetic field may be small and the apparatus may be small.

In accordance with the magnetic signal detection apparatus of the present invention, when the magnetic signal is to be detected from the magnetic signal recording medium by the magnetic detection element and the magnetic field application device, the direction of the biasing magnetic field is made closer to the right angle to the direction of the current flowing through the resistive element so that the magnetization M is oriented to ±45° or ±135° to the direction of the current and the maximum output with high linearity is attained with the small biasing magnetic field, the magnetic signal reproduction characteristic is improved, and the compactness of the entire apparatus is attained.

We claim:

1. A magnetic signal detection apparatus comprising:

an anisotropic resistive element arranged to face in a face-to-face fashion or perpendicularly to a magnetic signal recording surface on a substrate and made of a ferromagnetic metal thin film; and a magnetic field application apparatus for applying a biasing magnetic field of a predetermined angle to said resistive element;

wherein the direction of application of the biasing magnetic field by said magnetic field application device is set to meet the following formula to the direction of current flowing through said resistive element:

$$\alpha = \pm(\sin^{-1}((K_u+K_s)/H \times M) + \phi)$$

where $\phi$ is 45° or 135°, $\alpha$ is angle between current and biasing magnetic field, Ku is anisotropy energy, Ks is Contour anisotropy energy, H is biasing magnetic field, and M is saturation magnetization.

2. A magnetic signal detection apparatus according to claim 1 wherein the biasing magnetic field to the resistive element is approximately ±47°_ approximately ±75° to the direction of the current.

3. A magnetic signal detection apparatus according to claim 1 wherein the biasing magnetic field to the resistive element is approximately ±105°_ approximately ±133° to the direction of the current.

4. A magnetic signal detection apparatus according to claim 1 wherein a first resistive element group having a plurality of resistive elements connected in series and a second resistive element group having a plurality of resistive elements connected in series are connected, an output terminal is provided at a junction of said resistive element groups, opposite ends to the junction are connected to power supply terminals, the respective resistive elements are arranged face-to-face to the magnetic signal recording surface with a magnetic lattice pitch $\lambda$ and the first resistive element group and the second resistive element group are spaced by a distance equal to $n\lambda/2$ or $(n/2+\frac{1}{2})\lambda$ where n is an integer.

5. A magnetic signal detection apparatus comprising:
an anisotropic resistive element arranged to face in a face-to-face fashion or perpendicularly to a magnetic signal recording surface on a substrate and made of a ferromagnetic metal thin film; and
a magnetic filed application apparatus for applying a biasing magnetic field of a predetermined angle to said resistive element;
wherein when a biasing magnetic field strength by said magnetic field application device is 140 to 1400 Oersteds, a film thickness of the thin film of said resistive element is 0.05_0.1 μm and a film width is 8_20 μm, the direction of application of the biasing magnetic field by said magnetic field application device is approximately 47°_ approximately 75° or approximately 105°_ approximately 133° to the direction of the current flowing through said resistive element.

6. A magnetic signal detection apparatus according to claim 5 wherein said resistive element is a nickel-cobalt alloy.

7. A magnetic signal detection apparatus according to claim 5 wherein said resistive element is a nickel-iron alloy.

8. A magnetic signal detection apparatus according to claim 5 wherein said magnetic field application device is a ferrite magnet or a rare earth group magnet.

* * * * *